United States Patent
Chintarlapalli Reddy et al.

(10) Patent No.: US 11,056,253 B2
(45) Date of Patent: Jul. 6, 2021

(54) THIN-FILM RESISTORS WITH FLEXIBLE TERMINAL PLACEMENT FOR AREA SAVING

(71) Applicant: QUALCOMM Incorporated, San Diego, CA (US)

(72) Inventors: Harikrishna Chintarlapalli Reddy, Bengaluru (IN); Alvin Leng Sun Loke, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/800,949

(22) Filed: Feb. 25, 2020

(65) Prior Publication Data
US 2020/0303094 A1 Sep. 24, 2020

Related U.S. Application Data (60) Provisional application No. 62/819,811, filed on Mar. 18, 2019.

(51) Int. Cl.
*H01C 1/01* (2006.01)
*H01L 27/01* (2006.01)

(52) U.S. Cl.
CPC .............. *H01C 1/01* (2013.01); *H01L 27/016* (2013.01)

(58) Field of Classification Search
CPC ................................ H01C 1/01; H01L 27/016
See application file for complete search history.

(56) References Cited

U.S. PATENT DOCUMENTS

| 4,906,966 | A | * | 3/1990 | Imamura | H01C 17/23 219/121.68 |
| 5,763,955 | A | * | 6/1998 | Findley | H01L 23/528 257/775 |
| 5,969,658 | A | | 10/1999 | Naylor | |
| 6,060,760 | A | | 5/2000 | Tan | |
| 7,034,653 | B2 | * | 4/2006 | Bhattacharya | H01C 1/14 257/E21.004 |
| 7,403,094 | B2 | * | 7/2008 | Beach | H01L 23/5228 257/536 |
| 9,502,354 | B2 | * | 11/2016 | Inoue | G06F 30/394 |

(Continued)

FOREIGN PATENT DOCUMENTS

EP 0450648 A1 10/1991

OTHER PUBLICATIONS

International Search Report and Written Opinion—PCT/US2020/019841—ISA/EPO—dated Jul. 16, 2020.

(Continued)

*Primary Examiner* — Kyung S Lee
(74) *Attorney, Agent, or Firm* — Chui-kiu T. Wong (57) ABSTRACT

An apparatus including a dielectric layer; and a set of thin-film resistors arranged in a row extending in a first direction on the dielectric layer, wherein lengths of the set of thin-film resistors in a second direction substantially orthogonal to the first direction are substantially the same, wherein the set of thin-film resistors includes a first subset of one or more thin-film resistors with respective terminals spaced apart by a first distance, and wherein the set of thin-film resistors includes a second subset of one or more thin-film resistors with respective terminals spaced apart by a second distance, the first distance being different than the second distance.

12 Claims, 8 Drawing Sheets

(56) References Cited

U.S. PATENT DOCUMENTS

| | | | |
|---|---|---|---|
| 9,583,238 B2* | 2/2017 | Kondo | H01C 1/14 |
| 9,960,116 B2* | 5/2018 | Ohshima | H01L 23/5228 |
| 2002/0140053 A1 | 10/2002 | Lee | |
| 2006/0238292 A1* | 10/2006 | Beach | H01L 27/016 |
| | | | 338/309 |
| 2008/0036036 A1 | 2/2008 | Wada | |

OTHER PUBLICATIONS

Partial International Search Report—PCT/US2020/019841—ISA/EPO—dated May 20, 2020.

* cited by examiner

THIN-FILM RESISTORS WITH FLEXIBLE TERMINAL PLACEMENT FOR AREA SAVING

CROSS-REFERENCE TO RELATED APPLICATION

This application claims priority to U.S. Provisional Patent Application, Ser. No. 62/819,811, filed on Mar. 18, 2019, which is incorporated herein by reference.

FIELD

Aspects of the present disclosure relate generally to thin-film resistors, and in particular, to thin-film resistors with flexible terminal placement for integrated circuit (IC) area saving.

DESCRIPTION OF RELATED ART

Thin-film resistors are used often in integrated circuits (ICs) to implement the specified functionality for the IC. However, thin-film resistors do often occupy substantial amount of IC footprint. In order to make efficient use of IC area, it is desirable to layout thin-film resistors, and use techniques to provide thin-film resistors in ICs in an IC area efficient manner.

SUMMARY

The following presents a simplified summary of one or more implementations in order to provide a basic understanding of such embodiments. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus including a dielectric layer; and a set of thin-film resistors arranged in a row extending in a first direction on the dielectric layer, wherein lengths of the set of thin-film resistors in a second direction substantially orthogonal to the first direction are substantially the same, wherein the set of thin-film resistors includes a first subset of one or more thin-film resistors with respective terminals spaced apart by a first distance, and wherein the set of thin-film resistors includes a second subset of one or more thin-film resistors with respective terminals spaced apart by a second distance, the first distance being different than the second distance.

Another aspect of the disclosure relates to an apparatus including a dielectric layer; and a set of thin-film resistors arranged in a row extending in a first direction on the dielectric layer, wherein a first subset of one or more thin-film resistors of the set has a first length in a second direction substantially orthogonal to the first direction, and wherein a second subset of one or more thin-film resistors of the set has a second length in the second direction, the second length being different than the first length.

Another aspect of the disclosure relates to an apparatus including a dielectric layer; and a set of thin-film resistors arranged in a row extending in a first direction on the dielectric layer, wherein a first subset of one or more thin-film resistors of the set include a first number of one or more thin-film resistors stacked in a second direction substantially orthogonal to the first direction, and wherein a second subset of one or more thin-film resistors of the set include a second number of one or more thin-film resistors stacked in the second direction, the first number being different than the second number.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
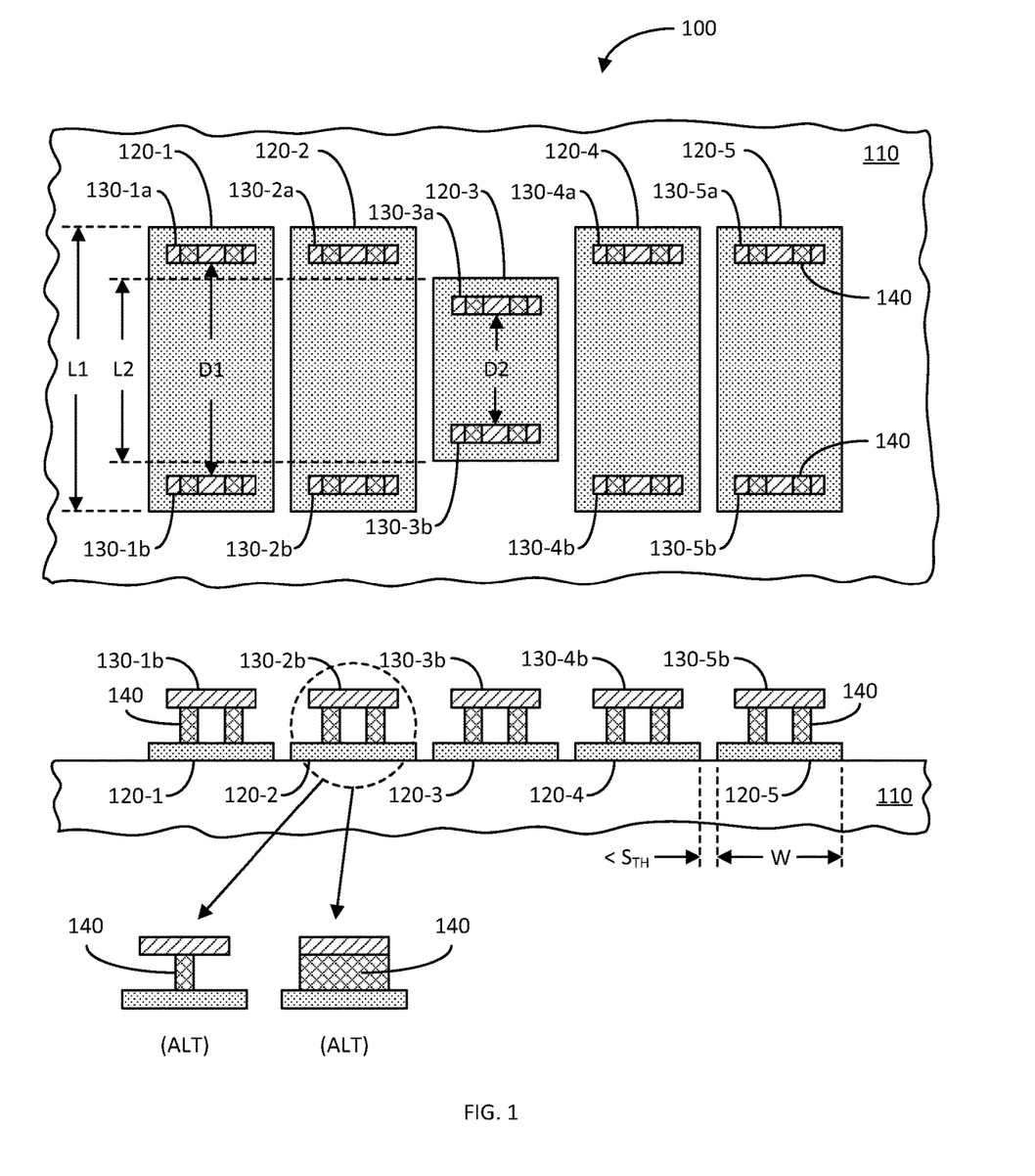
FIG. 1 illustrates plan and side views of an integrated circuit (IC) including thin-film resistors and corresponding resistor terminals in accordance with an aspect of the disclosure.

FIG. 1 illustrates plan and side views of an integrated circuit (IC) layer 100 including thin-film resistors and corresponding resistor terminals in accordance with an aspect of the disclosure. In some cases, in an IC layout design, thin-film resistors are arranged in arrays to make efficient use of IC area. For instance, the IC layer 100 includes a dielectric (electrically-insulating, e.g., oxide) layer 110 and a row of thin-film resistors 120-1 to 120-5 disposed on the dielectric layer 110. In the examples provided herein, the row direction is horizontal, and the resistor length direction is vertical (i.e., substantially orthogonal to the row direction) or in the column direction.

In this example, there are five (5) thin-film resistors; however, it shall be understood that the IC layer 100 may include more or less. The dielectric layer 110 may be any layer in an IC, such as below metal layer one (M1), middle-of-line (MOL) layers, higher layers, such as between metal layers 4-5, or any other layer as desired by a designer.

Each of the thin-film resistors 120-1 to 120-5 is formed by depositing a refractory metal, such as Titanium-Nitride (TiN) or other suitable material, and patterning the material into individual squares or rectangles, and all aligned in a row. Subsequently, terminals including electrical contacts 130-1a/130-1b to 130-5a/130-5b and metallized via holes 140 (e.g., copper, tungsten, cobalt, etc.) are formed on the thin-film resistors. The length (L) of each of the thin-film resistors extend from the top edge to the bottom edge of the material. The distance (D) of each of the thin-film resistors extends from the top terminal to the bottom terminal.

The resistance of each of the thin-film resistor is directly-related to the resistivity of the material (e.g., TiN) and the distance (D) between the terminals, and inversely-related to the width (W) of the thin-film resistor. As shown, the metalized via holes 140 may take different forms, such as including one or more separate via holes as shown in the main figure and in one of the alternatives, or a solid square or rectangle as shown in the other alternative.

In this example, the left-two and the right-two thin-film resistors 120-1, 120-2, 120-4, and 120-5 have substantially the same length L1, substantially the same distance between each of their terminals D1, and substantially the same width W. Accordingly, the thin-film resistors 120-1, 120-2, 120-4, and 120-5 all have substantially the same resistance. This is because they are made out of the same resistive material (e.g., TiN), they have the same width W, and they have the same distance D1 between their respective terminal pair.

However, in this example, the middle thin-film resistor 120-3 has a different (smaller) length L2, a different (smaller) distance between its terminals D2, but substantially the same width W. Accordingly, the thin-film resistor 120-3 has a smaller resistance than the others 120-1, 120-2, 120-4, and 120-5 because, although the resistor material and the width W are the same, the distance D2 between its respective terminals is smaller than the distance D1 between the respective terminals of the other thin-film resistors 120-1, 120-2, 120-4, and 120-5.

Some IC manufacturing foundries have design rule check (DRC) that govern what is acceptable IC features and what is not acceptable IC features. With regard to this example, an IC foundry may have a DRC that prohibits having different lengths (L) thin-film resistors if they are placed in the same row and if the spacing between adjacent resistors is less than a threshold $S_{TH}$. This may be because the variable-length thin-film resistor pattern across a small spacing ($<S_{TH}$) may be difficult to reproduce in a reliable manner. In this example, according to such DRC, the middle thin-film resistor 120-3 is not allowed because it has a length L2 different than the length L1 of the others 120-1, 120-2, 120-4, and 120-5, and the spacings between thin-film resistors 120-2 and 120-3 and 120-3 and 120-4 is less than the spacing threshold $S_{TH}$.

If, in this example, the spacings between thin-film resistors 120-2 and 120-3 and 120-3 and 120-4 were greater than the spacing threshold $S_{TH}$, the thin-film resistor 120-3 could have a length L2 different than L1 without violating the DRC rule. Further, according to this example, the spacing between each of the adjacent thin-film resistors may vary, but are less than the spacing threshold $S_{TH}$ requiring them to have the same length. Just an example, if there is a DRC requirement for a minimum spacing $S_{MIN}$ between each adjacent thin-film resistors, then the spacing threshold $S_{TH}$ may be set to equal or more than twice the minimum spacing $S_{MIN}$.

Figure 2:
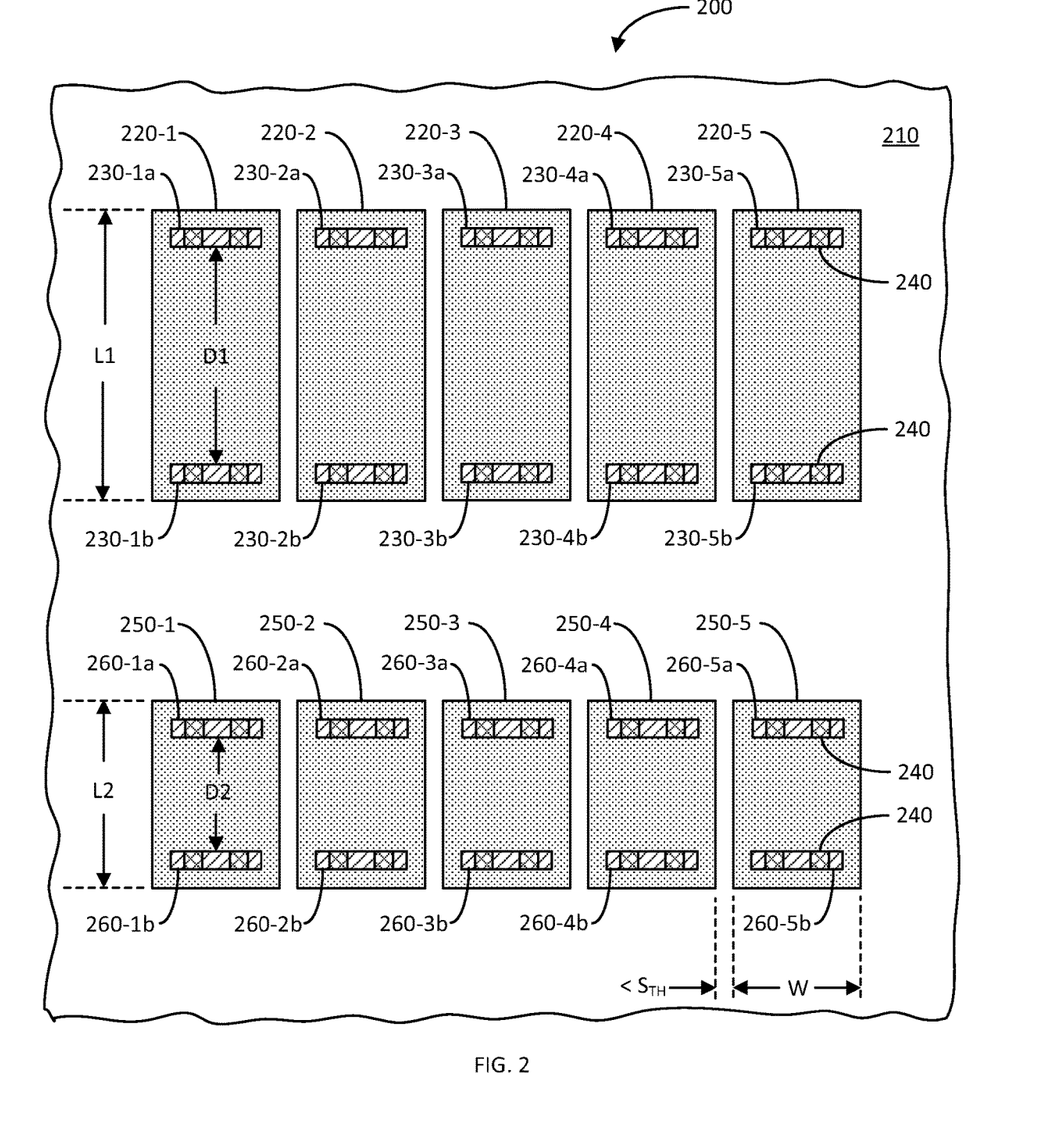
FIG. 2 illustrates a plan view of another exemplary IC including two-rows of thin-film resistors with corresponding resistor terminals in accordance with another aspect of the disclosure.

FIG. 2 illustrates a plan view of another exemplary IC layer 200 including two-rows of thin-film resistors with corresponding resistor terminals in accordance with another aspect of the disclosure. Thus, a solution to having thin-film resistors with different resistances is to use two rows of thin-film resistors. For instance, the IC layer 200 includes a first row of thin-film resistors 220-1 to 220-5 formed on a dielectric (electrical-insulating, e.g., oxide) layer 210. These thin-film resistors 220-1 to 220-5 include terminals having metal contacts 230-1a/230-1b to 230-5a/230-5b coupled to the resistive material via metalized via holes 240, respectively.

In this example, each of the thin-film resistors 220-1 to 220-5 have the same length L1; thus, they do not violate the DRC that requires the thin-film resistors to have the same length if they are arranged in the same row and the spacing between each adjacent resistor is less than the spacing threshold $S_{TH}$. Although, typically not a hard DRC requirement, the thin-film resistors 220-1 to 220-5 may have different widths, but they are usually manufactured with the same width. Thus, because the thin-film resistors 220-1 to 220-5 have the same resistivity material (e.g., TiN), the same width W, and the same distance D1 between their respective terminals, the resistances of the thin-film resistors 220-1 to 220-5 are substantially the same.

To have a thin-film resistor with a resistance different than the resistance of thin-film resistors 220-1 to 220-5, such thin-film resistor needs to be implemented in a different row so as not to violate the aforementioned DRC. In this regard, the IC layer 200 includes a second row of thin-film resistors 250-1 to 250-5. These thin-film resistors 250-1 to 250-5 include terminals having metal contacts 260-1a/260-1b to 260-5a/260-5b coupled to the resistive material via metalized via holes 240, respectively.

In this example, the thin-film resistors 250-1 to 250-5 have the same length L2; thus, they do not violate the DRC that requires the thin-resistors to have the same length if they are arranged in the same row and the spacing between each adjacent resistor is less than the spacing threshold $S_{TH}$. The thin-film resistors 250-1 to 250-5 also have the same width W. Thus, because the thin-film resistors 250-1 to 250-5 have the same resistivity material (e.g., TiN), the same width W, and the same distance D2 between their respective terminals, the resistances of the thin-film resistors 250-1 to 250-5 are substantially the same. Further, because the distance D2 between the respective terminals of the thin-film resistors 250-1 to 250-5 is smaller than the distance D1 between the respective terminals of thin-film resistors 220-1 to 220-5, the resistance of thin-film resistors 250-1 to 250-5 is less than the resistance of thin-film resistors 220-1 to 220-5.

Thus, as is clearly illustrated, an IC layer that needs to include thin-film resistors having different resistances and the spacing between each adjacent resistor is less than the spacing threshold $S_{TH}$ requires different rows of thin-film resistors. This is an inefficient use of IC area. Further, in some cases, some of the thin-film resistors in a row may not be needed; they may be simply "dummy" resistors. That further occupies IC area that can be utilized for other features. Thus, there is a need to provide thin-film resistors having different resistances in a single row without violating the DRC rule against having different length thin-film resistors in the same row and a spacing between each adjacent resistor to be less than a spacing threshold $S_{TH}$.

Figure 3:
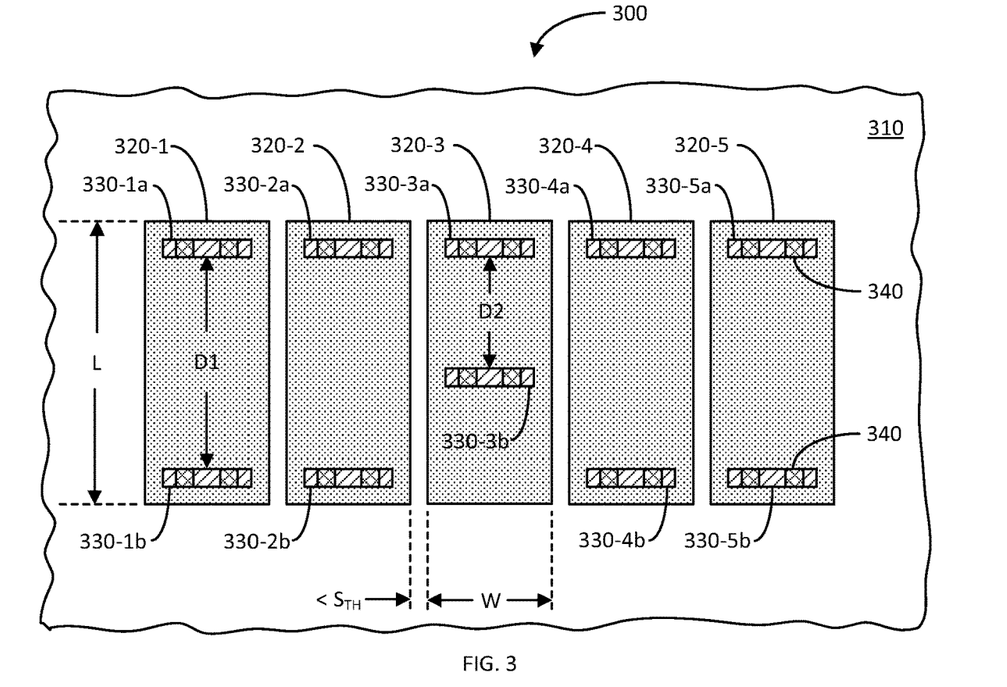
FIG. 3 illustrates a plan view of another exemplary IC layer including thin-film resistors with corresponding resistor terminals in accordance with another aspect of the disclosure.

FIG. 3 illustrates a plan view of another exemplary IC layer 300 including thin-film resistors with corresponding resistor terminals in accordance with another aspect of the disclosure. In this example, the IC layer 300 includes thin-film resistors 320-1 to 320-5 arranged in the same row. The thin-film resistors 320-1 to 320-5 have substantially the same length L; and thus, do not violate the DRC that requires thin-film resistors to have the same length if they are placed in the same row and the spacing between each adjacent resistors is less than the spacing threshold $S_{TH}$. However, the distances between their respective terminals are not all the same; thereby, allowing the resistors to have different resistances without requiring another row of resistors to achieve the different resistance resistor.

In particular, the IC layer 300 includes a set of thin-film resistors 320-1 to 320-5 formed on a dielectric (e.g., oxide) layer 310 and arranged in a single row with the same or different spacings between adjacent resistors, albeit each smaller than the spacing threshold $S_{TH}$. Although in this example, there are five (5) thin-film resistors, it shall be understood that the row may have more or less resistors. As previously mentioned, the material used for the resistive material may be made out of a refractory metal (e.g., TiN) or other suitable material. Further, the lengths L (in the directional orthogonal to the row direction) of the thin-film resistors 320-1 to 320-5 are substantially the same. As discussed, this does not violate the aforementioned DRC rule.

The thin-film resistors 320-1 to 320-5 have terminals with electrical contacts 330-1a/330-1b to 330-5a/330-5b with metalized via holes 340 making electrical contact to the thin-film material, respectively. In the case of thin-film resistors 320-1, 320-2, 320-4, and 320-5, they have a distance D1 between their respective terminals. In the case of thin-film resistor 320-3, it has a distance of D2 between its respective terminals; the distance D2 being smaller than the distance D1 of the other resistors. Accordingly, the thin-film resistor 320-3 has a smaller resistance than the resistances of thin-film resistors 320-1, 320-2, 320-4, and 320-5 (assuming they are all made out of the same material and their widths W are the same).

Thus, in this example, the DRC rule requiring resistors in the same row to have the same length if the spacing between each adjacent resistor is smaller than the spacing threshold $S_{TH}$ is not violated as all the thin-film resistors 320-1 to 320-5 have substantially the same length L. Further, a set of one or more thin-film resistors (e.g., 320-1, 320-2, 320-4, and 320-5) has a resistance different than another set of one or more thin-film resistors (e.g., 320-3) without needing to include an additional row of resistors to achieve the different resistance. This technique provides a substantial savings in IC area, which may be used for other important features of the IC or to make the IC smaller in footprint.

In this example, the bottom terminal 330-3b of thin-film resistor 320-3 was moved upwards closer to the other terminal 330-3a to achieve the smaller distance D2. Thus, in this example, the top terminals 330-1a to 330-5a of the thin-film resistors 320-1 to 320-5 are substantially aligned horizontally, while the bottom terminals 330-1b, 330-2b, 330-4b, and 330-5b of the thin-film resistors 320-1, 320-2, 320-4, and 320-5 are substantially aligned horizontally, but not horizontally aligned with terminal 330-3b of thin-film resistor 320-3 as it has been moved upwards to achieve a different resistance.

Figure 4:
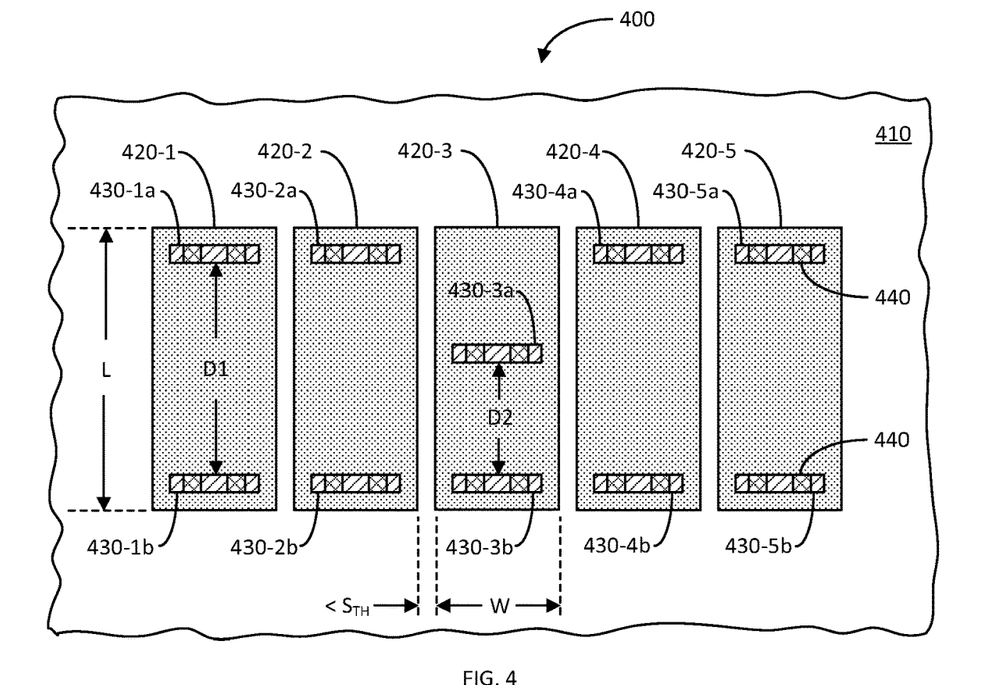
FIG. 4 illustrates a plan view of another exemplary IC layer including thin-film resistors with corresponding resistor terminals in accordance with another aspect of the disclosure.

FIG. 4 illustrates a plan view of another exemplary IC layer 400 including thin-film resistors with corresponding resistor terminals in accordance with another aspect of the disclosure. The IC layer 400 is a variation of IC layer 300, and the same elements are labeled with the same reference numbers with the exception that the most significant digit is a "4" instead of a "3". Thus, most of the detailed discussion of IC layer 400 has been provided above with respect to IC layer 300.

The difference in IC layer 400 is that the top terminal 430-3a of thin-film resistor 420-3 is moved downward closer to the other terminal 430-3b to achieve the smaller distance D2. Thus, in this example, the bottom terminals 430-1b to 430-5b of the thin-film resistors 420-1 to 420-5 are substantially aligned horizontally, while the top terminals 430-1a, 430-2a, 430-4a, and 430-5a of the thin-film resistors 420-1, 420-2, 420-4, and 420-5 are substantially aligned horizontally, but not horizontally aligned with the top terminal 430-3a of thin-film resistor 420-3 as it has been moved downward to achieve a different resistance. As in the previous implementations, the thin-film resistors 420-1 to 420-5 are formed on a dielectric layer 410.

Figure 5:
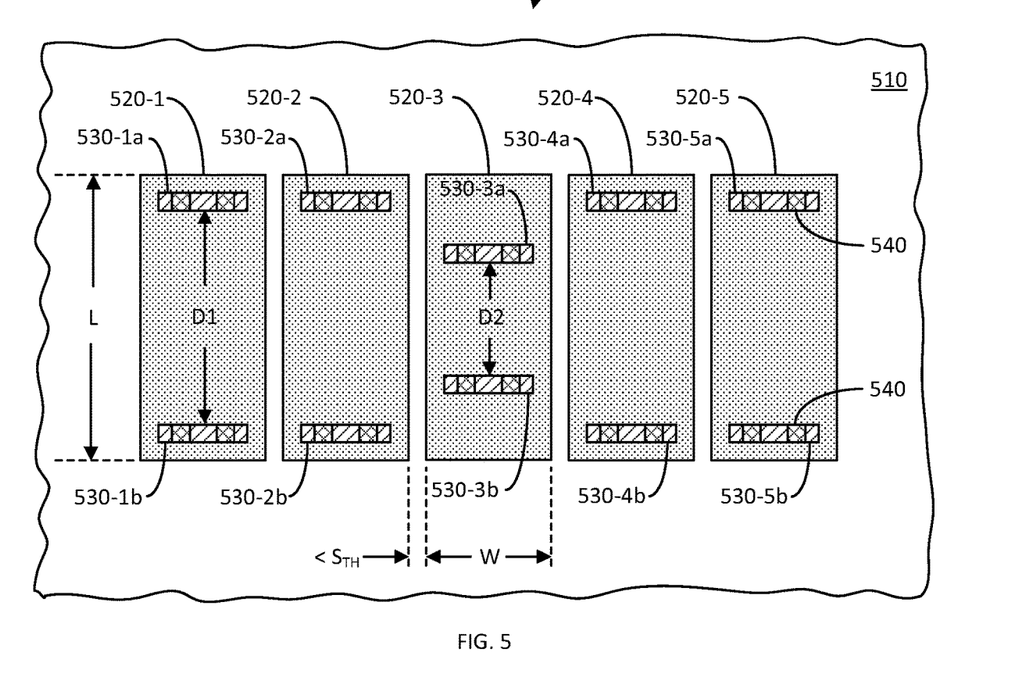
FIG. 5 illustrates a plan view of another exemplary IC layer including thin-film resistors with corresponding resistor terminals in accordance with another aspect of the disclosure.

FIG. 5 illustrates a plan view of another exemplary IC layer 500 including thin-film resistors with corresponding resistor terminals in accordance with another aspect of the disclosure. The IC layer 500 is another variation of IC layer 300, and the same elements are labeled with the same reference numbers with the exception that the most significant digit is a "5" instead of a "3". Thus, most of the detailed discussion of IC layer 500 has been provided above with respect to IC layer 300.

The difference in IC layer 500 is that both terminals 530-3a and 530-3b of thin-film resistor 520-3 have been moved inward (e.g., downward for terminal 530-3a and upward for terminal 530-3b) to achieve the smaller distance D2. Thus, in this example, the top and bottom terminals 530-1a/530-1b, 530-2a/530-2b, 530-4a/530-4b, and 530-5a/530-5b of thin-film resistors 520-1, 520-2, 520-4, and 520-5 are substantially aligned horizontally, but are not horizontally aligned with top and bottom terminals 530-3a and 530-3b of thin-film resistor 520-3, respectively. In this example, the amount of shifting of the terminals 530-3a and 530-3b need not be the same (but could be the same); and thus, the thin-film resistor 520-3 need not be symmetrical with respect to its terminals about the central horizontal axis of the row. As in the previous implementations, the thin-film resistors 520-1 to 520-5 are formed on a dielectric layer 510.

Figure 6:
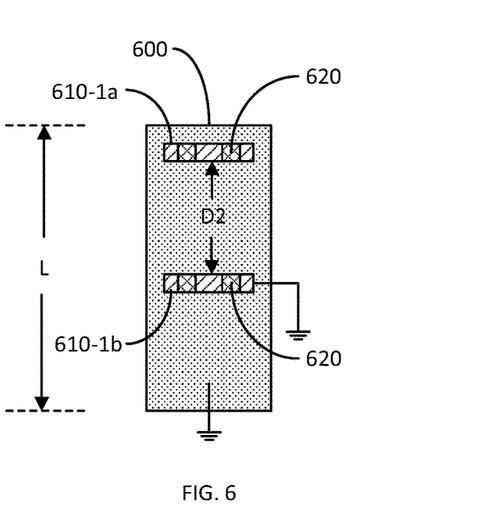
FIG. 6 illustrates a plan view of an exemplary thin-film resistor with corresponding resistor terminals and parasitic capacitance reducing technique in accordance with another aspect of the disclosure.

FIG. 6 illustrates a plan view of an exemplary thin-film resistor 600 with corresponding resistor terminals 610-1a and 610-1b (with vias 620) and a parasitic capacitance reducing technique in accordance with another aspect of the disclosure. The thin-film resistor 600 may be substituted for thin-film resistor 520-3 in IC layer 500. In this example, the bottom terminal 610-1b has been moved upwards to set the resistance for the thin-film resistor 600. As a result, there is a region of the thin-film resistor 600 below the bottom terminal 610-1b that does not contribute significantly to the resistance but is a source of parasitic capacitance. Further, there is current spreading and reflection that may affect the current flow from the top terminal 610-1a to the bottom terminal 610-1b.

The parasitic capacitance and current spreading reducing technique are to apply a voltage potential to that region being the same as the voltage potential applied to the bottom terminal 610-1b. For instance, in this example, the bottom terminal 610-1b is grounded. Thus, to reduce parasitic capacitance and current spreading in the region below the bottom terminal 610-1b, the region is also grounded by any suitable electrical connection. This technique also applies to the region above the top terminal 610-1a if that is the one that is shifted (lower); and thereby, the region is grounded if the top terminal is grounded.

Figure 7:
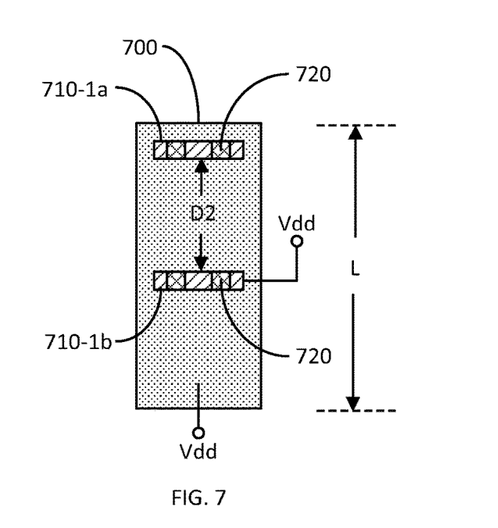
FIG. 7 illustrates a plan view of another exemplary thin-film resistor with corresponding resistor terminals and parasitic capacitance reducing technique in accordance with another aspect of the disclosure.

FIG. 7 illustrates a plan view of another exemplary thin-film resistor 700 with corresponding resistor terminals and parasitic capacitance reducing technique in accordance with another aspect of the disclosure. The thin-film resistor 700 may be substituted for thin-film resistor 520-3 in IC layer 500. The thin-film resistor 700 is a variation of thin-film resistor 600; and thus, includes substantially the same elements as indicated by the same reference numbers but with the most significant digit being a "7" rather than a "6". In this example, a supply voltage Vdd (which could be positive or negative) is applied to the bottom terminal 710-1b of thin-film resistor 700.

As mentioned above with respect to thin-film resistor 600, to reduce the parasitic capacitance and current spreading in the region below the terminal 710-1b, the same voltage potential applied to the bottom terminal 710-1b is applied to the region. Since supply voltage Vdd is applied to the bottom terminal 710-1b, to reduce parasitic capacitance and current spreading in the region below the bottom terminal 710-1b, the supply voltage Vdd is also applied to that region by any suitable electrical connection. This technique also applies to the region above the top terminal 710-1a if that is the one that is shifted (lower); and thereby, the supply voltage Vdd is applied to the region if the top terminal also receives the supply voltage Vdd.

For deciding as to which terminal to move inward, it is generally up to the designer. However, a guideline would be to move the terminal that is less sensitive to parasitic capacitance for circuit operation. For example, if the bottom terminal of a thin-film resistor is less sensitive to parasitic capacitance (or conversely, the top terminal is more sensitive to parasitic capacitance), then the bottom terminal is moved upward and the top terminal may be left near the top end according to the DRC rule. Similarly, if the top terminal of a thin-film resistor is less sensitive to parasitic capacitance (or conversely, the bottom terminal is more sensitive to parasitic capacitance), then the top terminal is moved downward and the bottom terminal is left near the bottom end according to the DRC rule.

In case a foundry has a DRC rule specifying a minimum feature density, dummy layers may be placed underneath these thin-film resistors so that the minimum density requirement is met. For example, if the thin-film resistors reside below metal layer one (M1), dummy fills of oxide-diffusion RX (OD) (e.g., first oxide layer for forming devices) and/or polysilicon PB (poly) may be formed underneath the thin-film resistors in order to meet the DRC minimum density requirement. In the case the thin-film resistors formed on higher layers (e.g., metal layer M4 or M5), dummy fills of lower metal layers (e.g., metal layers M1, M2, and M3) may be formed underneath the thin-film resistors in order to meet the DRC minimum density requirement.

Figure 8:
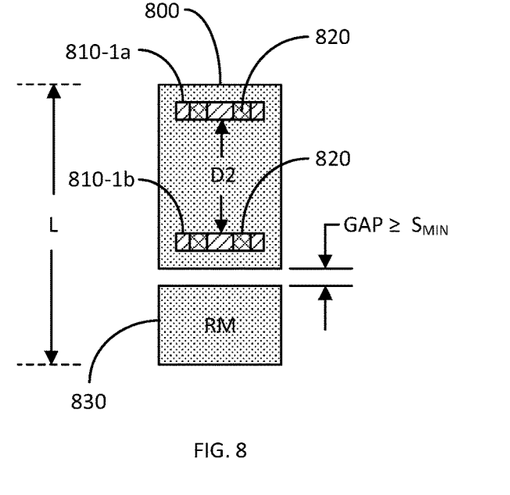
FIG. 8 illustrates a plan view of another exemplary thin-film resistor with corresponding resistor terminals and parasitic capacitance reducing technique in accordance with another aspect of the disclosure.

FIG. 8 illustrates a plan view of another exemplary thin-film resistor 800 with corresponding resistor terminals and parasitic capacitance reducing technique in accordance with another aspect of the disclosure. The thin-film resistor 800 may be substituted for thin-film resistor 520-3 in IC layer 500. The thin-film resistor 800 is another variation of thin-film resistor 600; and thus, includes substantially the same elements as indicated by the same reference numbers but with the most significant digit being a "8" rather than a "6".

In this implementation, to substantially eliminate the parasitic capacitance, a gap is formed in the resistive material (RM) of the thin-film resistor 800 below the lower terminal 810-1b. Thus, the thin-film resistor 800 includes the upper and lower terminals 810-1a and 810-1b formed on an upper resistive material layer, with a distance of D2 between the terminals to achieve the desired resistance. The thin-film resistor 800 includes a lower resistive material (RM) layer 830 separated from the upper resistive material layer by a gap.

Thus, the lower RM layer is substantially electrically isolated from the upper RM layer. The length L of the thin-film resistor 800, in a directional orthogonal to the direction of the row of resistors, is the length of the upper resistive material layer in the orthogonal row direction, the spacing ($\geq S_{MIN}$) of the gap in the orthogonal row direction, and the length of the lower resistive material (RM) layer in the orthogonal row direction. The spacing of the gap may be set to greater than or equal to a minimum spacing $S_{MIN}$ set by a DRC of a foundry. The length of the lower resistive material (RM) layer in the orthogonal row direction may also need to comply with a minimum length set by a DRC of a foundry. Since the lower resistive material (RM) layer is electrically isolated from the upper resistive material layer upon which the terminals 810-1a and 810-1b are disposed, the lower resistive material (RM) layer does not significantly add parasitic capacitance to the lower terminal 810-1b of the thin-film resistor 800.

It shall be understood that this technique is also applicable to the case where the top terminal 810-1a is moved closer to the bottom terminal 810-1b. In which case, there would be a lower resistive material layer upon which the terminals 810-1a and 810-1b are disposed, a gap above the lower resistive material layer, and an upper resistive material layer above the gap. Thus, due to the gap, the upper resistive material (RM) layer is substantially electrically isolated from the lower resistive material layer (as well as the terminals 810-1a and 810-1b). Accordingly, the upper resistive material (RM) layer does not significantly add parasitic capacitance to the upper terminal 810-1a of the thin-film resistor 800.

Figure 9:
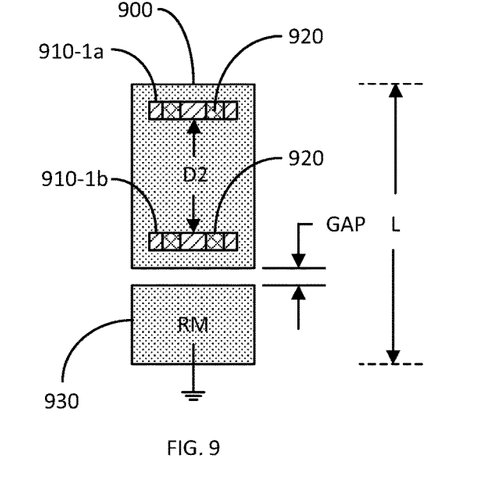
FIG. 9 illustrates a plan view of another exemplary thin-film resistor with corresponding resistor terminals and parasitic capacitance reducing technique in accordance with another aspect of the disclosure.

FIG. 9 illustrates a plan view of another exemplary thin-film resistor 900 with corresponding resistor terminals and parasitic capacitance reducing technique in accordance with another aspect of the disclosure. The thin-film resistor 900 may be substituted for thin-film resistor 520-3 in IC layer 500. The thin-film resistor 900 is a variation of thin-film resistor 800; and thus, includes substantially the same elements as indicated by the same reference numbers but with the most significant digit being a "9" rather than a "8".

The thin-film resistor 900 differs from thin-film resistor 800 in that the lower resistive material (RM) layer in thin-film resistor 900 is electrically coupled to a lower voltage rail (e.g., ground), and the lower resistive material (RM) layer in thin-film resistor 800 is floating. Based on DRCs of certain foundries, there may be restrictions on having floating layers of resistive materials. In such case, grounding the lower resistive material (RM) layer in thin-film resistor 900 would satisfy the corresponding DRC requirement. The grounding of the resistive material (RM) is also applicable if the gap and resistive material (RM) is situated above the resistive material upon which the terminals 910-1a and 910-1b are disposed.

Figure 10:
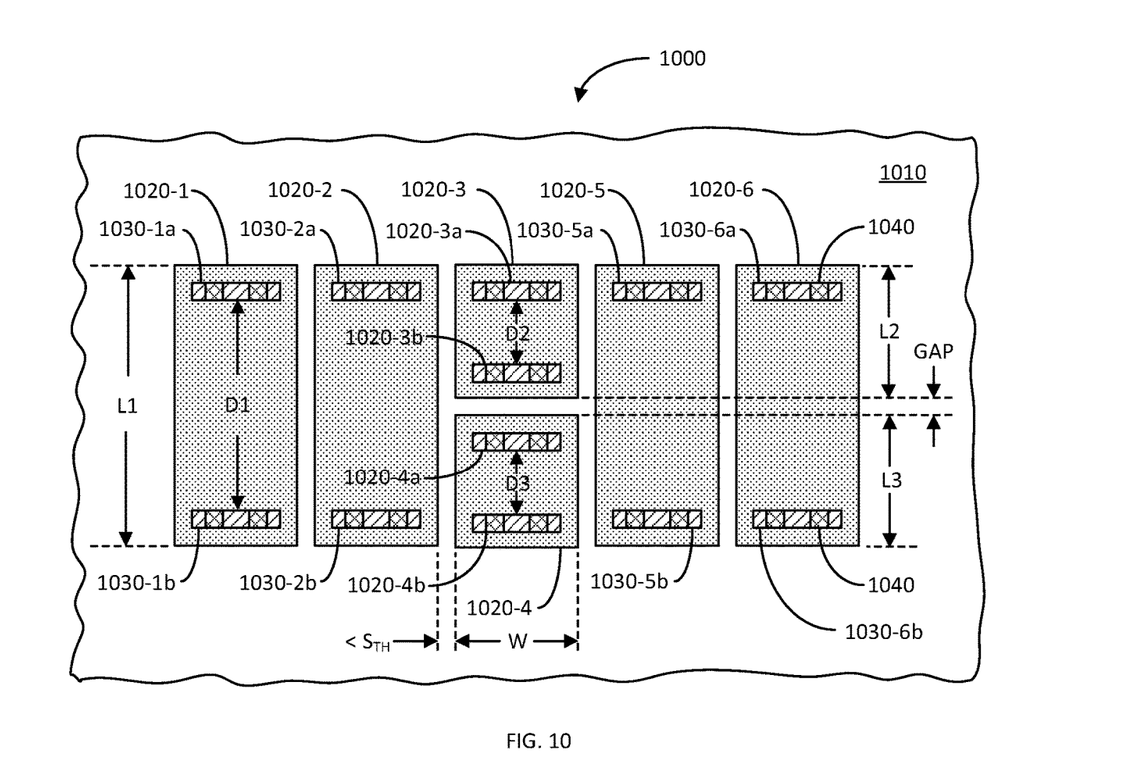
FIG. 10 illustrates a plan view of an exemplary row of thin-film resistors with vertically-aligned (stacked) resistors in accordance with another aspect of the disclosure.

FIG. 10 illustrates a plan view of an exemplary row of thin-film resistors 1000 with vertically-aligned (stacked) resistors in accordance with another aspect of the disclosure. The row 1000 includes thin-film resistors 1020-1, 1020-2, 1020-3, 1020-4, 1020-5, and 1020-6. The thin-film resistors 1020-1, 1020-2, 1020-5, and 1020-6 have a length of L1 in the orthogonal row direction, their upper and lower boundaries (in the direction orthogonal to the row) are substantially aligned in the horizontal (row) direction, their upper and lower terminals 1030-1a/1030-1b, 1030-2a/1030-2b, 1030-5a/1030-5b, and 1030-6a/1030-6b are substantially aligned in the horizontal (row) direction, and the distance between their respective terminals is D1 to set their resistances (which would be substantially the same if their widths are the same and they are made out of the same resistive material).

The left and right (row direction) boundaries of the thin-film resistors 1020-3 and 1020-4 are substantially aligned in the vertical (orthogonal row) direction, respectively. The thin-film resistor 1020-3 has a length of L2 in the vertical (orthogonal row) direction, its upper boundary (in the orthogonal row direction) is substantially aligned with the upper boundaries of thin-film resistors 1020-1, 1020-2, 1020-5, and 1020-6. The thin-film resistor 1020-4 has a length of L3 in the vertical (orthogonal row) direction, its lower boundary (in the orthogonal row direction) is substantially aligned with the lower boundaries of thin-film resistors 1020-1, 1020-2, 1020-5, and 1020-6. The lower and upper boundaries of the thin-film resistors 1020-3 and 1020-4 are separated by a gap, which may need to meet a minimum feature spacing $S_{MIN}$ requirement.

The thin-film resistor 1020-3 has a lower terminal 1030-3b separated from the upper terminal 1030-3a by a distance of D2 in the orthogonal row direction to set its resistance. Similarly, the thin-film resistor 1020-4 has an upper terminal 1030-4a separated from the lower terminal 1030-4b by a distance of D3 in the orthogonal row direction to set its resistance. Although, as illustrated, D2 is the same as D3, it shall be understood that D2 may be different than D3. Thus, in this example, the length L1 of the thin-film resistors 1020-1, 1020-2, 1020-5, and 1020-6 is substantially the same as the sum of the length L2 of thin-film resistor 1020-3, the length L3 of thin-film resistor 1020-4, and the gap between the resistors 1020-3 and 1020-4. Accordingly, the gap that is used in thin-film resistors 800 and 900 to reduce or eliminate parasitic capacitance may be used to stack (in the column direction) multiple resistors in a row.

Figure 11A:
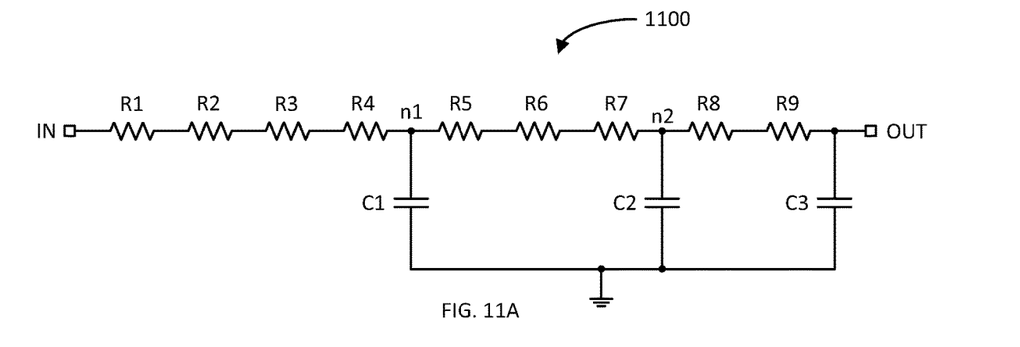
FIG. 11A illustrates a schematic of an exemplary low pass filter (LPF) in accordance with another aspect of the disclosure.

FIG. 11A illustrates a schematic of an exemplary low pass filter (LPF) 1100 in accordance with another aspect of the disclosure. The LPF 1100 serves to exemplify various concepts of the thin-film resistors described herein. The LPF 1100 is a variation of a resistor-capacitor (RC) filter.

In particular, the LPF 1100 includes a first set of resistors R1, R2, R3, and R4 coupled in series between an input (IN) and a first intermediate node n1. The resistors R1, R2, R3, and R4 may have substantially the same resistance (e.g., 2.7 kilo Ohms (kΩ)). A first capacitor C1 is coupled between the first intermediate node n1 and a lower voltage rail (e.g., ground).

The LPF 1100 further includes a second set of resistors R5, R6, and R7 coupled in series between the first intermediate node n1 and a second intermediate node n2. The resistors R5, R6, and R7 may have substantially the same resistance (e.g., 2.3 kΩ). A second capacitor C2 is coupled between the second intermediate node n2 and the lower voltage rail (e.g., ground).

Additionally, the LPF 1100 includes a third set of resistors R8 and R9 coupled in series between the second intermediate node n2 and an output (OUT). The resistors R8 and R9 may have substantially the same resistance (e.g., 1.2 kΩ). A third capacitor C3 is coupled between the output and the lower voltage rail (e.g., ground).

Figure 11B:
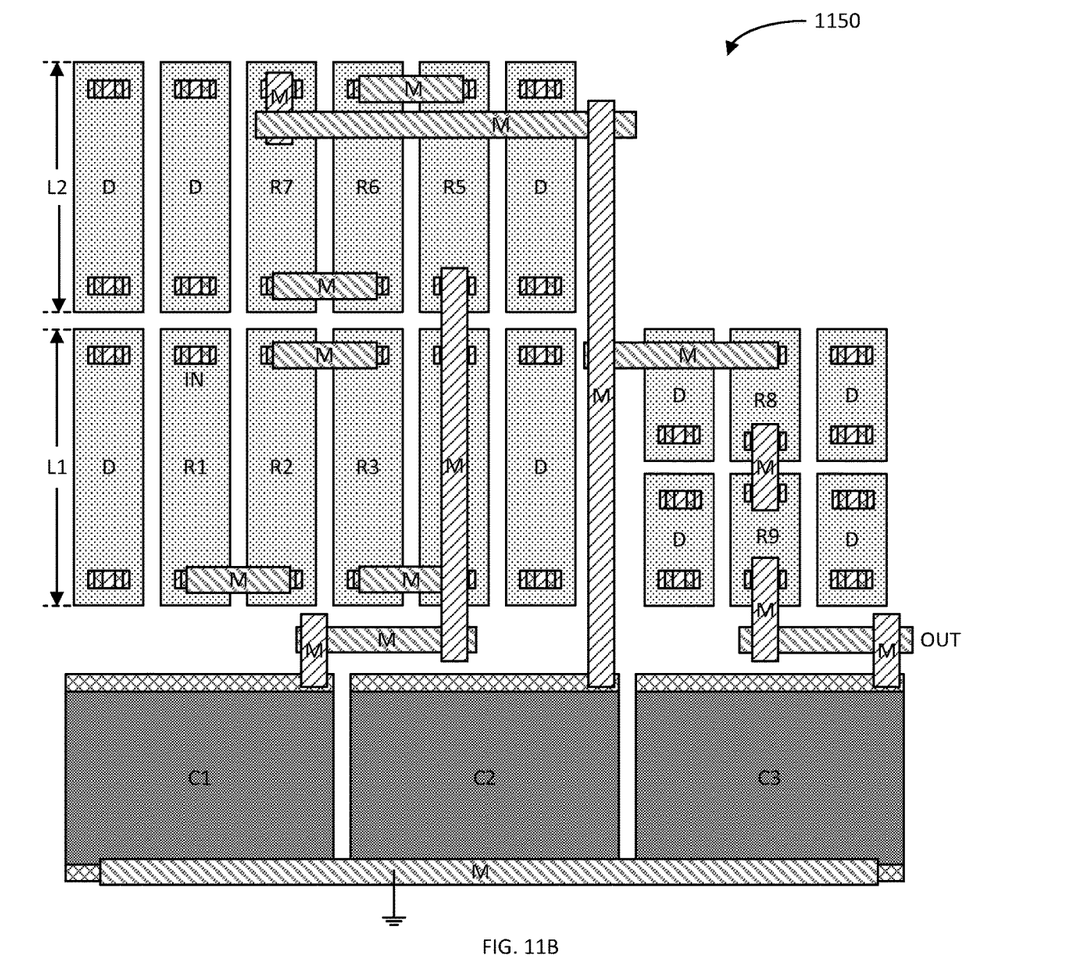
FIG. 11B illustrates a plan view of an exemplary integrated circuit (IC) layout of the low pass filter (LPF) of FIG. 11A in accordance with another aspect of the disclosure.

FIG. 11B illustrates a plan view of an exemplary integrated circuit (IC) layout 1150 of the LPF 1100 in accordance with another aspect of the disclosure. The LPF layout 1150 includes the first set of resistors R1-R4 in a first row with dummy (D) resistors at opposite ends of the row. As in the previous exemplary implementations, the upper and lower boundaries of the resistors R1-R4 and dummies (D) are substantially aligned in the horizontal (row) direction, respectively. Similarly, the upper and lower terminals of the resistors R1-R4 and dummies (D) are also substantially aligned in the horizontal (row) direction. The distances between the respective upper and lower terminals of the resistors R1-R4 and dummies (D) are substantially the same, and configured to achieve the desired resistance (e.g., 2.7 kΩ) for the resistors R1-R4. The terminals of all the dummy (D) resistors may be electrically coupled to the lower voltage rail (e.g., ground).

As the second set of resistors R5-R7 have a different resistance (e.g., 2.3 kΩ) than the first set of resistors R1-R4 (e.g., 2.7 kΩ), the second set of resistors R5-R7 are located in a second row with dummy resistors (D) at opposite ends. For area efficiency and ease of processing, the second row includes two dummy resistors (D) at the left end of the row, and one dummy resistor (D) on the right end of the row. This allows the two left dummies (D), resistors R7, R6, R5, and the right dummy (D) of the second row to substantially aligned in the vertical or column (orthogonal to the row) direction with the left dummy resistor (D), resistors R1-R4, and right dummy resistor (D) of the first row, respectively.

Also, as the third set of resistors R8 and R9 have a different resistance (e.g., 1.2 kΩ) than the first set of resistors R1-R4 (e.g., 2.7 kΩ) and the second set of resistors R5-R7, the third set of resistors R5-R7 are located in a third row, albeit the third row may be substantially aligned in the row direction with the first row. It is considered a separate row because the first and third rows are separated by a distance greater than the threshold distance $S_{TH}$, and the resistors R8 and R9 may be isolated from the first row by their own dummy resistors (D).

The third row includes: two left dummy resistors (D) stacked in the orthogonal row (column) direction with a gap separating them; resistors R8 and R9 stacked in the orthogonal row (column) direction with a gap separating them; and two right dummy resistors (D) stacked in the orthogonal row (column) direction with a gap separating them. The separate gaps may be a continuous gap extending in the row direction.

The upper boundaries of resistor R8 and the upper dummy resistors (D) are substantially aligned (in the row direction) with the upper boundaries of the resistors in the first row. Also, the upper terminals of the resistor R8 and the upper dummy resistors (D) are substantially aligned (in the row direction) with the upper terminals of the resistors in the first row. Similarly, the lower boundaries of resistor R9 and the lower dummy resistors (D) are substantially aligned (in the row direction) with the lower boundaries of the resistors in the first row. Also, the lower terminals of the resistor R9 and the lower dummy resistors (D) are substantially aligned (in the row direction) with the lower terminals of the resistors in the first row.

The first, second, and third capacitors C1, C2, and C3 are situated below the first and third rows of resistors. Metallization traces (M), which could reside in a plurality of metal layers, electrically couple the resistors and capacitors together to form the LPF 1100 as indicated in the schematic in FIG. 11A.

In particular, the input pin or node (IN) is at the upper terminal of resistor R1. To implement the series connection of resistors R1-R4, there is a metallization trace (M) electrically coupling the lower terminals of resistors R1 and R2 together, another metallization trace (M) electrically coupling the upper terminals of resistors R3 and R4 together, and another metallization trace (M) electrically coupling the lower terminals of resistors R3 and R4 together. To electrically couple resistor R4 to resistor R5 and capacitor C1, there is a metallization trace (M) that electrically couples the upper terminal of resistor R4 to the lower terminal of resistor R5 and upper terminal of capacitor C1.

To implement the series connection of resistors R5-R7, there is a metallization trace (M) electrically coupling the upper terminals of resistors R5 and R6 together, and another metallization trace (M) electrically coupling the lower terminals of resistors R6 and R7 together. To electrically couple resistor R7 to resistor R8 and capacitor C2, there is a set of metallization traces (M) that electrically couple the upper terminal of resistor R7 to the upper terminals of resistor R8 and capacitor C2.

To implement the series connection of resistors R8-R9, there is a metallization trace (M) electrically coupling the lower terminal of resistor R8 to the upper terminal of resistor R9. To electrically couple resistor R9 to capacitor C3, there is a set of metallization traces (M) electrically coupling the lower terminal of resistor R9 to the upper terminal of capacitor C3. The output pin or node (OUT) may be located on the last set of metallization traces (M). A metallization trace (M), coupled to the lower voltage rail (e.g., ground), electrically couples together the lower terminals of the capacitors C1-C3.

A drawback of the IC layout 1150 of the LPF 1100 is that it requires three rows of resistors to implement resistors R1-R9 of the LPF. As discussed below, by using the techniques described herein to implement resistors of different resistances in the same row, the IC layout of the LPF 1100 may be implemented with substantially less footprint.

Figure 12:
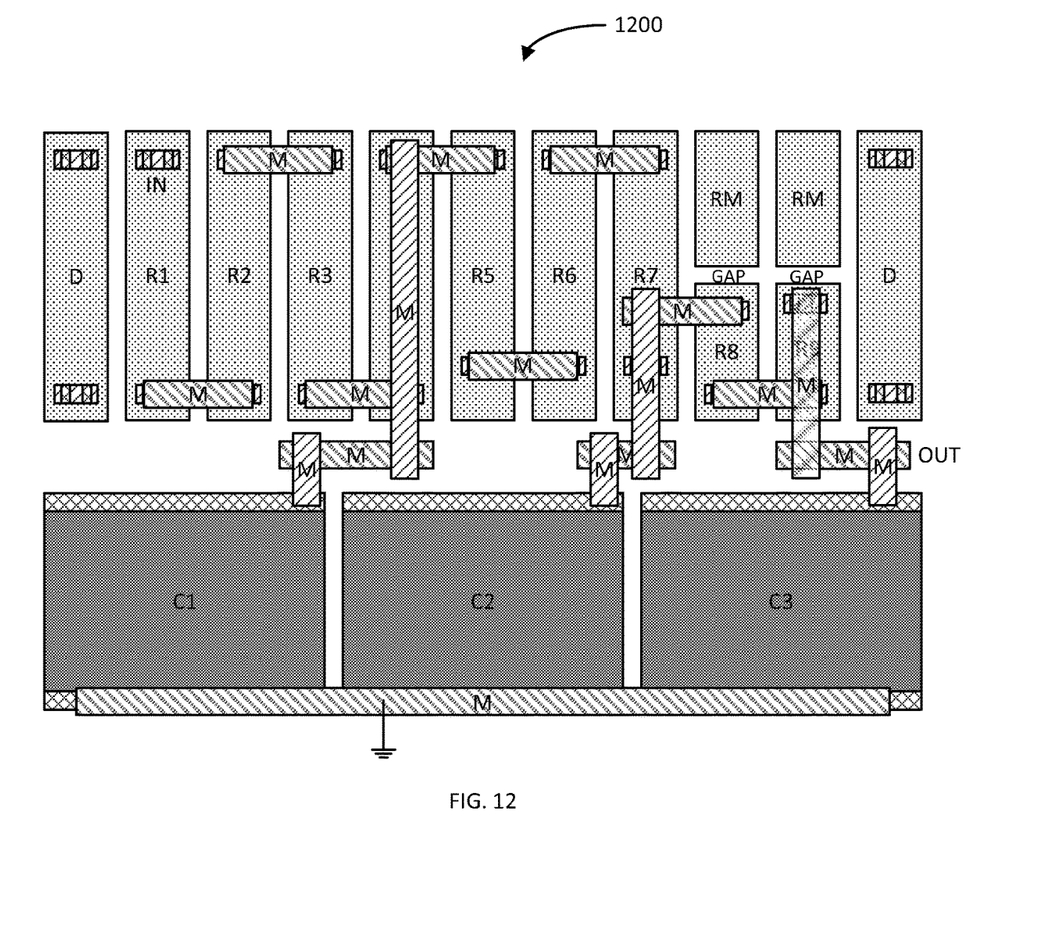
FIG. 12 illustrates a plan view of another exemplary integrated circuit (IC) layout of the low pass filter (LPF) of FIG. 11A in accordance with another aspect of the disclosure.

FIG. 12 illustrates a plan view of another exemplary integrated circuit (IC) layout 1200 of the LPF 1100 in accordance with another aspect of the disclosure. In IC layout 1200, all of the resistor R1-R9 of the LPF is implemented in a single row and bounded by dummy resistors (D) on both sides of the row, respectively. The resistive material (RM) of resistors R1-R7 including the dummy resistors (D) has substantially the same length L in the orthogonal row direction.

To achieve the smaller resistance (e.g., 2.3 kΩ) of resistors R5-R7 compared to the resistance of resistors R1-R4, the lower terminals of resistors R5-R7 are moved upwards and do not align with the lower terminals of resistors R1-R4 in the row direction. This allows the resistors R5-R7 to achieve a lower resistance, as discussed in detail with reference to resistors 320-3 and 420-3 previously discussed.

Similarly, to achieve the even smaller resistance (e.g., 1.2 kΩ) of resistors R8-R9 compared to the resistances of resistors R1-R4 and resistors R5-R7, the upper terminals of resistors R5-R7 are moved downwards and do not align with the upper terminals of resistors R1-R7 in the row direction. This allows the resistors R8-R9 to achieve a lower resistance, as discussed in detail with reference to resistors 800 and 900 previously discussed. These resistors R8 and R9 include or are associated with a floating (or grounded) resistive material (RM) layer aligned above the resistors R8 and R9 in the orthogonal row direction. Accordingly, the upper boundaries of the resistive material (RM) layer substantially align with the upper boundaries of resistors R1-R7 and dummy resistors (D), and the lower boundaries of resistors R8-R9 substantially align with the lower boundaries of resistors R1-R7 and dummy resistors (D).

Figure 13:
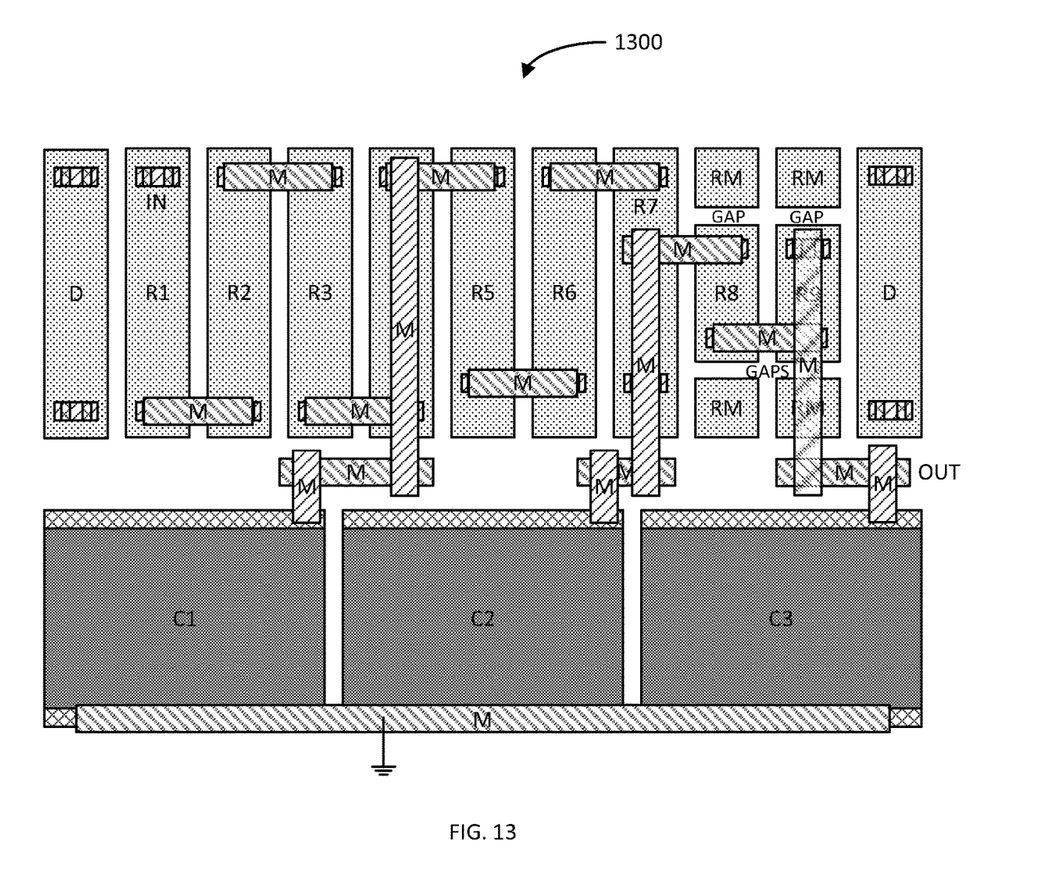
FIG. 13 illustrates a plan view of yet another exemplary integrated circuit (IC) layout of the low pass filter (LPF) of FIG. 11A in accordance with another aspect of the disclosure.

FIG. 13 illustrates a plan view of yet another exemplary integrated circuit (IC) layout 1300 of the LPF 1100 in accordance with another aspect of the disclosure. The IC layout 1300 is a variation of IC layout 1200 previously discussed, with the exception that both the upper and lower terminals of resistors R8 and R9 are moved downward and upwards, respectively; and consequently, do not align with the lower and upper terminals of resistors R1-R7 and dummy resistors (D) in the row direction. These resistors R8 and R9 include or are associated with a floating (or grounded) resistive material (RM) layers aligned above and below the resistors R8 and R9 in the orthogonal row direction. Accordingly, the upper boundaries of the upper resistive material (RM) layer substantially align with the upper boundaries of resistors R1-R7 and dummy resistors (D), and the lower boundaries of lower resistive material substantially align with the lower boundaries of resistors R1-R7 and dummy resistors (D).

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:
1. An apparatus, comprising:
a dielectric layer; and
a set of thin-film resistors arranged in a row extending in a first direction on the dielectric layer, wherein lengths of the set of thin-film resistors extending in a second direction substantially orthogonal to the first direction are substantially the same, wherein the set of thin-film resistors includes a first subset of one or more thin-film resistors with respective terminals spaced apart by a first distance, and wherein the set of thin-film resistors includes a second subset of one or more thin-film resistors with respective terminals spaced apart by a second distance, the first distance being different than the second distance, wherein a first subset of one or more terminals of the first subset of one or more thin-film resistors is substantially aligned in the first direction with a first subset of one or more terminals of the second subset of one or more thin-film resistors, and wherein a second subset of one or more terminals of the first subset of thin-film resistors is not aligned in the first direction with a second subset of one or more terminals of the second subset of one or more thin-film resistors, and wherein the second subset of one or more terminals of the second subset of one or more thin-film resistors is configured to receive a voltage potential, and wherein one or more regions of thin-film resistive material upon which the second subset of one or more terminals are disposed are configured to receive the voltage potential from another one or more electrical connection, respectively.

2. The apparatus of claim 1, wherein one or more boundaries of the first subset of one or more thin-film resistors is substantially aligned in the first direction with one or more boundaries of the second subset of one or more thin-film resistors.

3. The apparatus of claim 1, wherein one or more terminals of the first subset of one or more thin-film resistors is substantially aligned in the first direction with one or more terminals of the second subset of one or more thin-film resistors.

4. The apparatus of claim 3, wherein one or more other terminals of the first subset of one or more thin-film resistors is not aligned in the first direction with one or more other terminals of the second subset of one or more thin-film resistors.

5. The apparatus of claim 1, wherein one or more pairs of terminals of the first subset of one or more thin-film resistors is not aligned in the first direction with one or more pairs of terminals of the second subset of one or more thin-film resistors, respectively.

6. The apparatus of claim 1, wherein the set of thin-film resistors have substantially the same width.

7. The apparatus of claim 1, wherein the set of thin-film resistors are made out of the same material.

8. The apparatus of claim 7, wherein the material comprises Titanium-Nitride (TiN).

9. The apparatus of claim 1, wherein the voltage potential comprises ground.

10. The apparatus of claim 1, wherein the voltage potential comprises a voltage on a supply rail.

11. The apparatus of claim 1, wherein a spacing between each adjacent thin-film resistors of the set is less than a threshold.

12. The apparatus of claim 1, wherein the set of thin-film resistors are bounded on opposite sides of the row by one or more dummy resistors, respectively.

* * * * *